(12) United States Patent
Hong

(10) Patent No.: US 6,423,639 B1
(45) Date of Patent: Jul. 23, 2002

(54) PLANARIZATION METHOD OF INSULATING LAYER FOR SEMICONDUCTOR DEVICE

(75) Inventor: Seok-ji Hong, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 204 days.

(21) Appl. No.: 09/603,202

(22) Filed: Jun. 26, 2000

(30) Foreign Application Priority Data

Sep. 9, 1999 (KR) .............................................. 99-38314

(51) Int. Cl.$^7$ ............................................. H01L 21/302
(52) U.S. Cl. ........................ 438/690; 438/691; 438/692
(58) Field of Search ................. 438/690–698, 438/626–646

(56) References Cited

U.S. PATENT DOCUMENTS

| | | |
|---|---|---|
| 5,491,113 A | 2/1996 | Murota |
| 5,877,080 A * | 3/1999 | Aoi et al. .................... 438/622 |

* cited by examiner

*Primary Examiner*—Jey Tsai
(74) *Attorney, Agent, or Firm*—Lee & Sterba, P.C.

(57) ABSTRACT

A method of planarizing an insulating layer for a semiconductor device, whereby a semiconductor substrate having a stepped surface due to material layer patterns of various sizes on the surface thereof is prepared. An interlayer insulating layer formed of an organic, low dielectric material covers the stepped surface of the semiconductor substrate. A capping insulating layer is formed on the interlayer insulating layer. A portion of the interlayer insulating layer which is higher than another portion of the interlayer insulating layer is selectively exposed by performing a partial chemical-mechanical polishing process on the capping insulating layer. The exposed portion of the interlayer insulating layer is plasma-processed to a predetermined depth. An entirely planarized interlayer insulating layer is formed by performing a blanket chemical-mechanical polishing process on the plasma processed portion of the interlayer insulating layer and the capping insulating layer. A silicon-methyl group bond is transformed into a silicon-hydroxide group bond by the plasma process in the organic low dielectric material.

15 Claims, 2 Drawing Sheets

PLANARIZATION METHOD OF INSULATING LAYER FOR SEMICONDUCTOR DEVICE

CROSS-REFERENCE TO RELATED APPLICATIONS

This application is based upon and claims priority from Korean Patent Application No. 99-38314 filed Sep. 9, 1999, the contents of which are incorporated herein by reference.

BACKGROUND OF THE INVENTION

1. Field of the Invention

The present invention relates to a fabrication method for a semiconductor device and, more particularly, to a method of planarizing an insulating layer using a chemical-mechanical polishing (CMP) method.

2. Description of the Related Art

As semiconductor devices become more highly integrated and as multilayer wiring structures are needed, the reduction of the dielectric constant of an interlayer insulating layer is required. To satisfy such a requirement, it has been suggested that a low-k dielectric material with a low-k dielectric constant be used for the interlayer insulating layer. Moreover, the interlayer insulating layer requires a high degree of flatness. To meet this requirement, it has been suggested that a polishing process using a chemical-mechanical polishing (CMP) process be used.

However, the CMP process is often accompanied by a dishing phenomenon. To prevent this phenomenon, the formation of a polishing stop layer on an insulating layer or between layers of an insulating layer having a multi-layer structure has been suggested.

SUMMARY OF THE INVENTION

A feature of the present invention provides a method of planarization of an insulating layer of a semiconductor device, wherein an interlayer insulating layer is formed from an organic material having a low dielectric constant. A chemical-mechanical polishing (CMP) method is used to obtain a flat surface.

To achieve this feature of the present invention, a method of planarization of an insulating layer of a semiconductor device is provided. The first step in the method according to the present invention is to prepare a semiconductor substrate having a stepped surface due to material layer patterns of various sizes on the surface thereof. An interlayer insulating layer is formed of an organic material which generally has a low dielectric constant. The interlayer insulating layer covers the stepped surface of the semiconductor substrate. A capping insulating layer is formed on the interlayer insulating layer. A portion of the interlayer insulating layer which rises above the other portion of the interlayer insulating layer is selectively exposed by performing a partial chemical-mechanical polishing process side of the capping insulating layer. The exposed portion of the interlayer insulating layer is plasma-processed to a preset depth. An entirely planarized interlayer insulating layer is formed by performing a blanket chemical-mechanical polishing process on the plasma processed portion of the interlayer insulating layer and the remaining capping insulating layer. A silicon-methyl group bond is transformed into a silicon-hydroxide group bond by the plasma process in the exposed surface of the low dielectric material.

According to the present invention, the higher rise of the transformed interlayer insulating layer formed of the organic material is rapidly polished by selectively performing the plasma process, thereby realizing global planarization of the interlayer insulating layer.

BRIEF DESCRIPTION OF THE DRAWINGS

These and other features, characteristics and advantages of the present invention will become more apparent to those skilled in the art from a study of the following detailed description in conjunction with the attached drawings, all of which form this application. In the drawings.

DETAILED DESCRIPTION OF THE PRESENTLY PREFERRED EXEMPLARY EMBODIMENT

Figure 1:
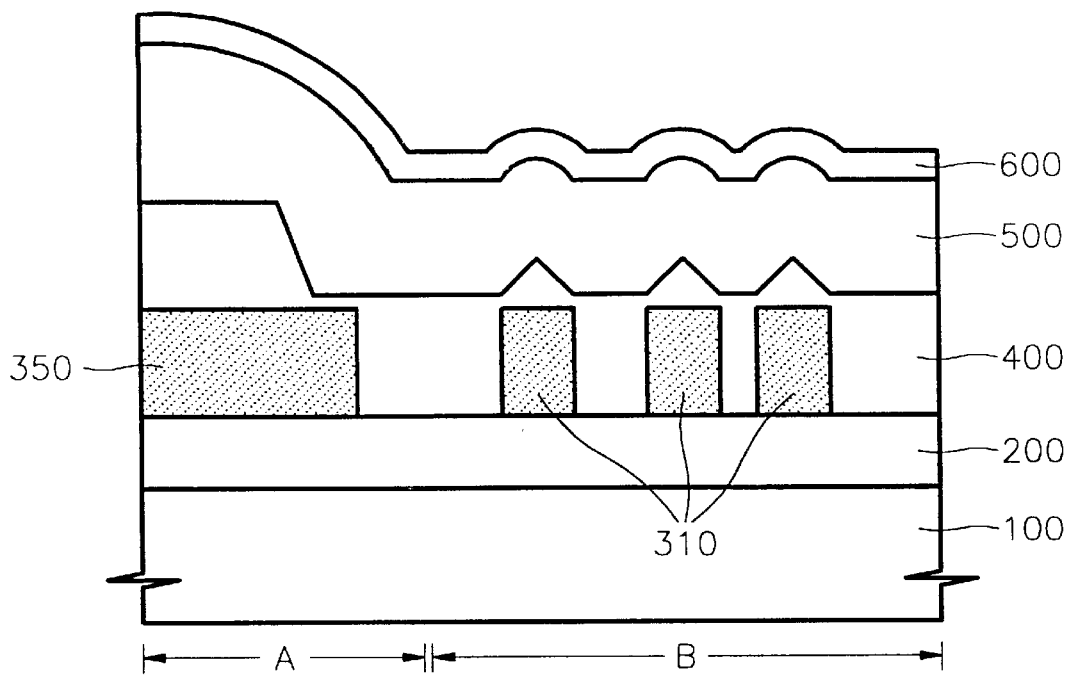
FIGS. 1 through 4 are schematic, cross-sectional views of a semiconductor device for explaining a method of planarization of an insulating layer of the semiconductor device according to the present invention.

The present invention now will be described more fully with reference to the accompanying drawings, in which a preferred embodiment of the invention is shown. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

In the embodiment of the present invention, a material having a low dielectric constant is indicative of a material with a lower dielectric constant than pure silicon oxide ($SiO_2$). Generally, silicon oxide has a dielectric constant of about 4.1. In the embodiment of the present invention, a material with a dielectric constant higher than silicon oxide is distinguished from the low dielectric material and called a high dielectric material. The low dielectric material is a low-k (k: dielectric constant) material. There are many kinds of low dielectric materials which are already known. It is generally known that low dielectric materials have a dielectric constant of about 1.5 through 3.5.

The present invention provides a method for achieving a high degree of flatness by forming an insulating layer using an organic, low dielectric material and applying a chemical-mechanical polishing (CMP) process to the insulating layer. Before performing the CMP process, the insulating layer is selectively plasma-processed to thereby achieve a high degree of planarization. The present invention will now be described in detail through the embodiment below.

FIG. 1 illustrates interlayer insulating layer 500, which is an organic, low dielectric material, formed on semiconductor substrate 100. Specifically, semiconductor substrate 100 has material layer patterns 310 and 350 of various sizes on the surface thereof. Material layer patterns 310 and 350 are electrically insulated from the semiconductor substrate 100 by insulating layer 200. For material layer patterns 310 and 350, a conductive layer pattern such as a metal wiring may be adopted.

Moreover, material layer patterns 310 and 350 may be sized as needed for the particular application. In other words, when structuring a semiconductor device, material layer pattern 310 of a relatively small size may be needed or material layer pattern 350 of a relatively large size may be needed. For example, in a cell area, a relatively small-sized material layer pattern 310 may be formed, as compared with a larger-sized material layer pattern 350 such as a pad formed in an area, for example, in a peripheral circuit area.

Gap filling insulating layer 400 is formed to fill up the gaps found in material layer pattern 310 or 350. Gap filling insulating layer 400 is preferably formed of an insulating material with good fluidity. Furthermore, gap filling insulating layer 400 is desirably formed of an insulating material having a low dielectric constant. For example, it is preferable that gap filling insulating layer 400 is comprised of a low dielectric material layer formed by a high density plasma-chemical vapor deposition (HDP-CVD), such as a silicon oxyfluoride (SiOF) layer.

Gap filling insulating layer 400 is formed on large-sized material layer pattern 350 more thickly than on small-sized material layer pattern 310. In other words, certain parts of the gap filling insulating layer 400 is formed on large-sized material layer pattern 350 as a relatively thick layer, while other parts of the gap filling insulating layer 400 is formed on small-sized material layer pattern 310 as a relatively thin layer. Accordingly, gap filling insulating layer 400 has a stepped surface covering area A, where it is formed as a relatively thick layer, and covering area B, where it is formed as a relatively thin layer.

Thereafter, the organic, low dielectric material is deposited on gap filling insulating layer 400, thereby forming interlayer insulating layer 500. The structure of such organic low dielectric material has a silicon-oxygen (Si—O) bond as a major bond and includes a silicon-methyl group (Si—$CH_3$) bond. An example of such a low dielectric material is an organic spin on glass (SOG) layer which is formed by a spin coating method. The organic SOG material is a low-k material and is known to exhibit a low dielectric constant of about 2.8 to 2.9. In addition to the organic SOG layer, many other low dielectric materials which are deposited by the spin coating method may be used as interlayer insulating layer 500.

For the deposition of a low dielectric material, the HDP-CVD method or the usual CVD method may be used. When forming the organic, low dielectric material using the CVD method, a reactive gas, which is a mixture of a silicon source gas and an organic source gas such as amorphous carbon or bis-cyclo-butadien (BCB), is used. It is known that an organic dielectric material layer including BCB exhibits a low dielectric constant of about 2.7.

As described above, interlayer insulating layer 500, which is formed of an organic, low dielectric material, is stepped along the stepped surface of the underlying semiconductor substrate 100. In other words, interlayer insulating layer 500 has a stepped surface due to the stepped surface of underlying gap filling insulating layer 400. Here, the portion of interlayer insulating layer 500 covering area A, which is formed as a relatively thick layer, is formed higher than the portion of interlayer insulating layer 500 covering area B, which is formed as a relatively thin layer. Although the thickness of interlayer insulating layer 500 may vary according to the design criteria of the semiconductor device, interlayer insulating layer 500 is preferably formed to a thickness of about 10,000 Å.

Next, capping insulating layer 600 is formed on interlayer insulating layer 500. Capping insulating layer 600 is usually introduced to complement a relatively low CMP rate of the organic, low dielectric material forming interlayer insulting layer 500. In this embodiment of the present invention, however, capping insulating layer 600 mainly serves as a mask, which allows a selectivity during a subsequent plasma processing step. Accordingly, capping insulating layer 600 may be formed relatively thin. Capping insulating layer 600 is preferably formed of silicon oxide ($SiO_2$) taking into account a polishing rate during a subsequent CMP step. For example, a plasma enhanced TEOS layer is used for capping insulating layer 600.

The resultant surface, after gap filling insulating layer 400, interlayer insulating layer 500, and capping insulating layer 600 are formed as stated above, is stepped due to the stepped surface of semiconductor substrate 100. This is due to the different sizes of underlying material layer patterns 310 and 350.

Figure 2:
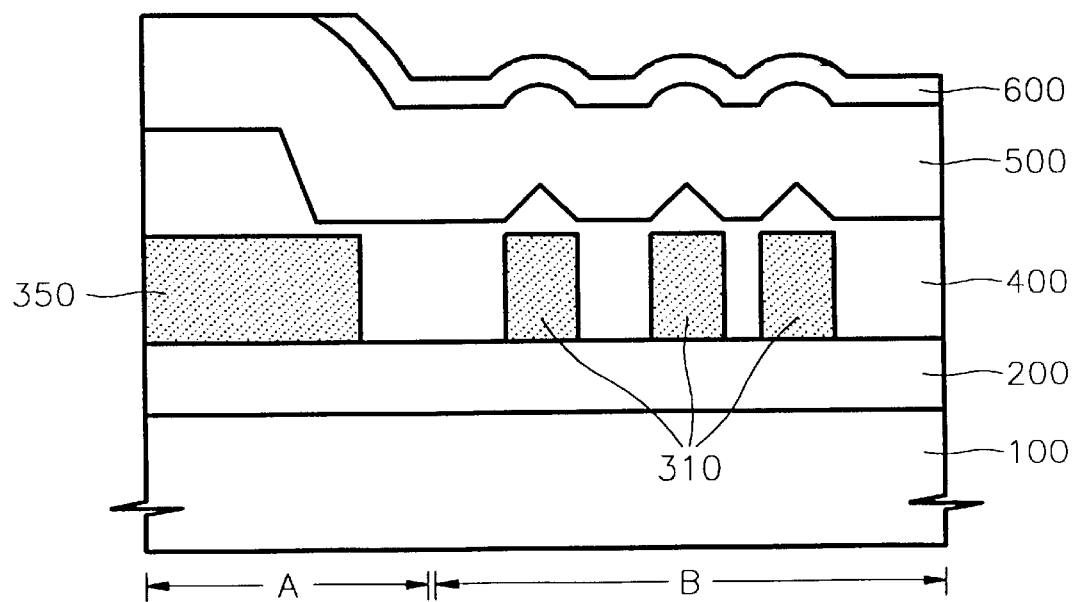

FIG. 2 depicts the portion of interlayer insulating layer 500 covering area A, which is formed as a relatively thick layer, being selectively exposed. Specifically, a partial CMP process is performed on capping insulating layer 600 having the stepped surface, to selectively polish and remove the portion of capping insulating layer 600 and interlayer insulating layer 500 whose surface is relatively higher than the remainder of the surface. In other words, only the portion of the capping insulating layer 600 covering area A, where interlayer insulating layer 500 is formed as a relatively thick layer, is selectively polished by the partial CMP process.

The partial CMP process may be performed taking advantage of the fact that the polishing is concentrated on the portion which covers area A, where the interlayer insulating layer 500 is formed as a relatively thick layer, and whose surface is higher than the remaining surface at the early stage of the CMP process. Namely, the portion of the capping insulating layer 600 covering the relatively thick area A can be selectively removed by controlling the polishing time to be short. Accordingly, the portion of interlayer insulating layer 500 formed as a relatively thick layer covering area A is selectively exposed. Hence, capping insulating layer 600 remains only in area B where interlayer insulating layer 500 is formed as a relatively thin layer, and the height of the surface of capping insulating layer 600 is thus relatively low.

Figure 3:
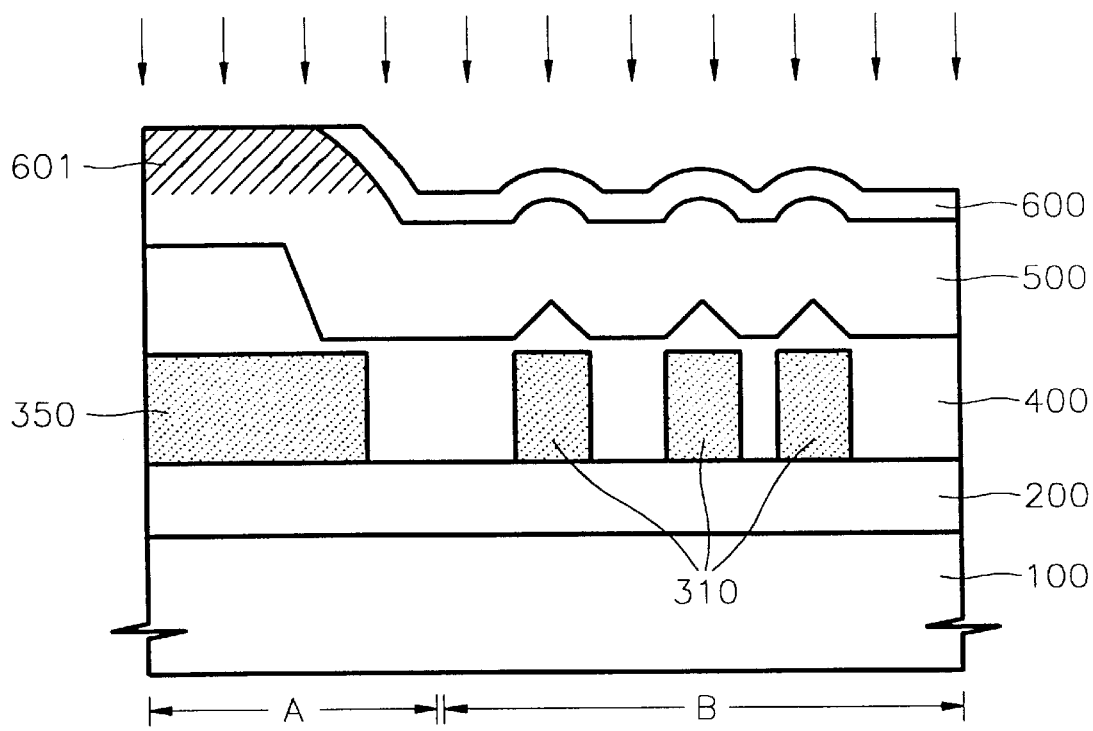

FIG. 3 depicts the exposed portion of interlayer insulating layer 500 being plasma-processed. Specifically, the plasma process is selectively performed on the portion of interlayer insulating layer 500 which has been selectively exposed by removal via polishing of the portion of capping insulating layer 600 covering area A. At this time, plasma is excited from a reactive gas such as oxygen ($O_2$) gas or dinitrogen monoxide ($N_2O$) gas.

The exposed portion of interlayer insulating layer 500 is mainly structured with the Si—O bond and includes the Si—$CH_3$ bond. It is known that the Si—$CH_3$ bond prohibits hydration associated with the CMP process. Accordingly, the organic, low dielectric material, including the Si—$CH_3$ bond, is usually known to have a very low CMP rate.

In this embodiment of the present invention, the plasma process transforms the Si—$CH_3$ bond into a Si—OH bond which prefers active hydration. In other words, the plasma excited from the oxygen gas or the dinitride monoxide gas reacts to the methyl group of the Si—$CH_3$ bond, and therefore, the Si—OH bond is formed and volatile by-products are discharged. The Si—OH bond allows the active hydration so that a relatively high polishing rate can be achieved in the CMP process.

The plasma process is performed on the exposed portion of interlayer insulating layer 500 to a predetermined depth using partially polished capping insulating layer 600 as a mask. Because capping insulating layer 600 is formed of a silicon oxide, it protects the underlying part, the part in section B of the semiconductor, from being influenced by the effect of the plasma process. Accordingly, the portion of interlayer insulating layer 500 covering the area B, which is formed as a relatively thin layer and which is protected by capping insulating layer 600, is not influenced by the plasma process. Therefore, the organic, low dielectric material state is maintained in the protected portion of interlayer insulating layer 500.

The depth of plasma-processed interlayer insulating layer portion 601 can be controlled by regulating the inner temperature of the chamber, the processing time, and/or the quantity of flow of the reactance gas during the plasma process. The plasma process is preferably performed such that the bottom of plasma-processed interlayer insulating layer portion 601 reaches the height of the surface of the portion of the interlayer insulating layer 500 covering the relatively thin layer area B.

Figure 4:
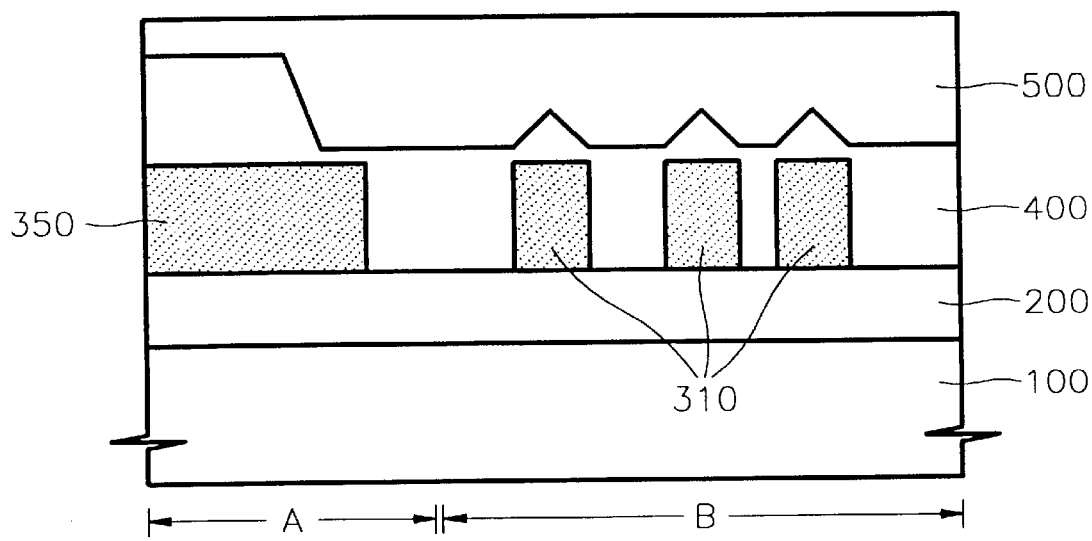

FIG. 4 shows a blanket CMP process being performed on plasma-processed interlayer insulating layer portion 601 and capping insulating layer 600. Specifically, the blanket CMP process is performed on the entire surface of the resultant structure obtained after performing the plasma process. Plasma-processed interlayer insulating layer portion 601 can be polished at a relatively high polishing rate by the CMP process. Plasma-processed interlayer insulating layer portion 601 is substantially transformed from the Si—$CH_3$ bond into the Si—OH bond, which prefers active hydration. Accordingly, a relatively high CMP rate is obtained, thereby improving a polishing characteristic.

The organic low dielectric material forming interlayer insulating layer 500 under capping insulating layer 600 exhibits a relatively slow polishing characteristic. Hydration may be inhibited by the Si—$CH_3$ bond in the organic, low dielectric material, resulting in a relatively low polishing rate.

As describe above, plasma-processed interlayer insulating layer portion 601, which covers the 'thick' area denoted by A is removed at a relatively high polishing rate, while the portion of interlayer insulating layer 500 which covers the 'thin' area and which has not been plasma-processed, is etched at a relatively low polishing rate, thereby easily achieving global planarization.

The blanket CMP process is preferably performed such that plasma-processed interlayer insulating layer portion 601 is completely removed. Because it is preferable that the bottom of plasma-processed interlayer insulating layer portion 601 is at the same height as the upper surface of interlayer insulating layer 500 which is not plasma-processed, the portion of the interlayer insulating layer 500 which is not plasma-processed is used as a stop point for the CMP process. The organic, low dielectric material forming interlayer insulating layer 500 which is not plasma processed, as described above, has a relatively low CMP rate, thereby serving as a polishing stop layer.

During the blanket CMP process, interlayer insulating layer 500 can be controlled to have different polishing rates depending upon how thin area B and how thick area A are formed. Thus, global planarization of the surface of interlayer insulating layer 500 can be achieved. Moreover, since plasma-processed interlayer insulating layer portion 601 has a relatively high polishing rate as compared to the organic, low dielectric material, the time necessary for the overall CMP process can be reduced. In addition, interlayer insulating layer 500 serves as the CMP stop point, thereby removing the extra step of forming a separate polishing stop layer.

Furthermore, in the case of forming the initial interlayer insulating layer 500 (FIG. 1) to a thickness of about 10000 Å, it can be ensured that the planarized interlayer insulating layer 500 (FIG. 4) has a thickness of about 8000 Å according to the present invention. On the other hand, in the case of performing planarization by using only the CMP process, it is generally known that the initial thickness of the interlayer insulating layer should be thicker than approximately 15000 Å to obtain a planarized interlayer insulating layer of about 8000 Å when planarized. Accordingly, the embodiment of the present invention allows the initial interlayer insulating layer 500 (FIG. 1) to be formed thinner than in the conventional art. Also, since it is not necessary to additionally form the polishing stop layer, the overall process can be shortened.

This invention may, however, be embodied in many different forms and should not be construed as being limited to the embodiment set forth herein. Rather, this embodiment is provided so that this disclosure will be thorough and complete, and will fully convey the concept of the invention to those skilled in the art.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A method of planarizing an insulating layer of a semiconductor device, the device including a semiconductor substrate having a stepped surface, an interlayer insulating layer using a low dielectric material covering the stepped surface, and a capping insulating layer on the interlayer insulating layer, the method comprising:
   selectively exposing a portion of the interlayer insulating layer which is higher than another portion of the interlayer insulating layer;
   plasma-processing the exposed portion of the interlayer insulating layer to a predetermined depth; and
   forming an entirely planarized interlayer insulating layer.

2. The method of claim 1, further comprising forming a gap filling insulating layer under the interlayer insulating layer to fill gaps induced by the stepped surface.

3. The method of claim 2, wherein the step of forming the gap filling insulating layer comprises using a material having a low dielectric constant.

4. The method of claim 3, wherein the step of using a material having a low dielectric constant to form the gap filling insulating layer comprises using silicon oxyfluoride.

5. The method of claim 1, wherein the step of forming the interlayer insulating layer using a low dielectric material includes forming a silicon-methyl group bond in a structure thereof.

6. The method of claim 5, further comprising the step of transforming the silicon-methyl group bond into a silicon-hydroxide group bond via the plasma process.

7. The method of claim 6, wherein the plasma process comprises utilizing plasma excited from one of an oxygen gas and a dinitride monoxide gas.

8. The method of claim 1, wherein the step of forming the interlayer insulating layer using a low dielectric material comprises depositing via one of a spin coating method and a chemical vapor deposition method.

9. The method of claim 1, wherein the step of forming the interlayer insulating layer using a low dielectric material comprises using one of an organic source including amorphous carbon and bis-cyclo-butadien in combination with a silicon source.

10. The method of claim 1, wherein the step of forming the capping insulating layer comprises forming a silicon oxide layer.

11. The method of claim 1, wherein the plasma processing step is performed by selectively plasma-processing the exposed portion of the interlayer insulating layer using the capping insulating layer as a mask.

12. The method of claim 1, wherein the blanket chemical-mechanical polishing process includes using a portion of the interlayer insulating layer which is not plasma-processed and underlies a portion of the interlayer insulating layer which is plasma-processed as a polishing stop point.

13. The method of claim 12, wherein the step of using a portion of the interlayer insulating layer which is not plasma-processed and underlies a portion of the interlayer insulating layer which is plasma-processed as a polishing stop point, includes having a bottom of the plasma-processed portion of the interlayer insulating layer extend at least to a height of an upper surface of the portion of the interlayer insulating layer protected by the capping insulating layer.

14. The method of claim 1, wherein the portion of the interlayer insulating layer is selectively exposed by partically chemical-mechanical polishing the capping insulating layer.

15. The method of claim 1, wherein the entirely planarized insulating interlayer is formed by performing a blanket chemical-mechanical polishing process on the plasma processed portion of the interlayer insulating layer and the capping insulating layer.

* * * * *